United States Patent [19]

Balakrishnan

[11] Patent Number: 5,161,098

[45] Date of Patent: Nov. 3, 1992

[54] HIGH FREQUENCY SWITCHED MODE CONVERTER

[75] Inventor: Balu Balakrishnan, Saratoga, Calif.

[73] Assignee: Power Integrations, Inc., Mountain View, Calif.

[21] Appl. No.: 756,487

[22] Filed: Sep. 9, 1991

[51] Int. Cl.$^5$ ............................................ H02M 1/00
[52] U.S. Cl. .................................... 363/144; 363/147; 174/52.4; 336/205; 361/392; 361/394; 361/421
[58] Field of Search ............... 174/52.4; 336/200, 205; 361/392, 394, 421; 363/144, 146, 147

[56] References Cited

U.S. PATENT DOCUMENTS

| | | | |
|---|---|---|---|
| 3,237,079 | 2/1966 | Mas | 363/146 |
| 4,253,231 | 3/1981 | Novet | 336/200 |
| 4,954,940 | 9/1990 | Chandler et al. | 363/146 |
| 4,975,671 | 12/1990 | Dirks | 336/200 |

Primary Examiner—Steven L. Stephan
Assistant Examiner—Jeffrey Sterrett
Attorney, Agent, or Firm—Thomas E. Schatzel

[57] ABSTRACT

A small, lightweight, efficient, very low cost AC adaptor for consumer electronics applications is realized by combining a switching regulator integrated circuit along with a leadframe adapted to mount the switching regulator integrated circuit off-center, a single-sided printed circuit board and high frequency ferrite cores. These components are assembled onto a substrate, such as a printed circuit board, by means of well-known, low-cost automatic insertion assembly machines. The novel structural aspects result in formation of a transformer from the leadframe and traces on the printed circuit board. The power supply resulting from this assembly method may be small enough to be molded into the plug portion of a standard AC power cord.

22 Claims, 4 Drawing Sheets

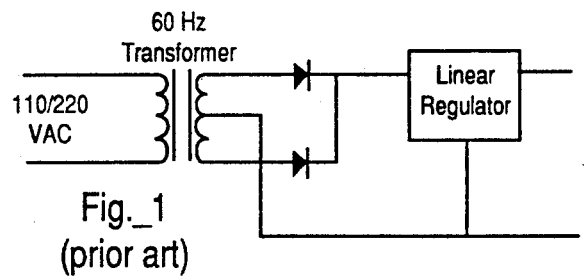
Fig._1
(prior art)
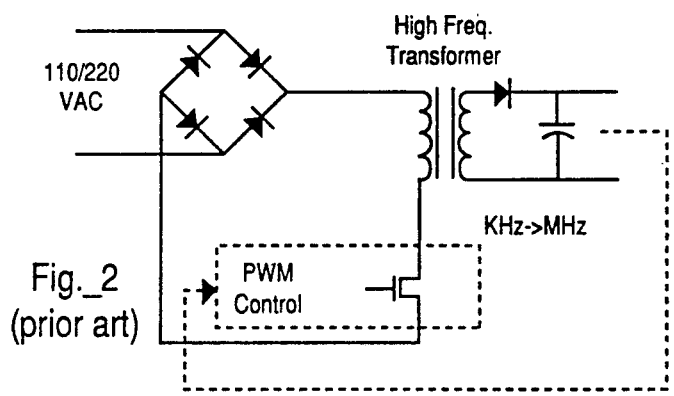
Fig._2
(prior art)
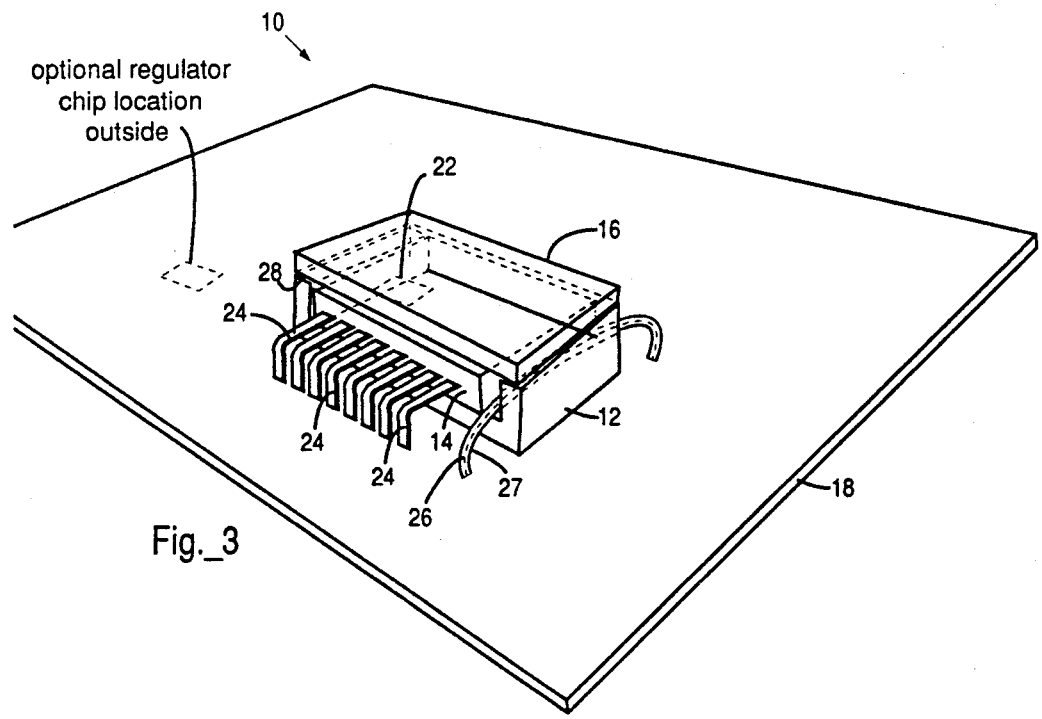
Fig._3

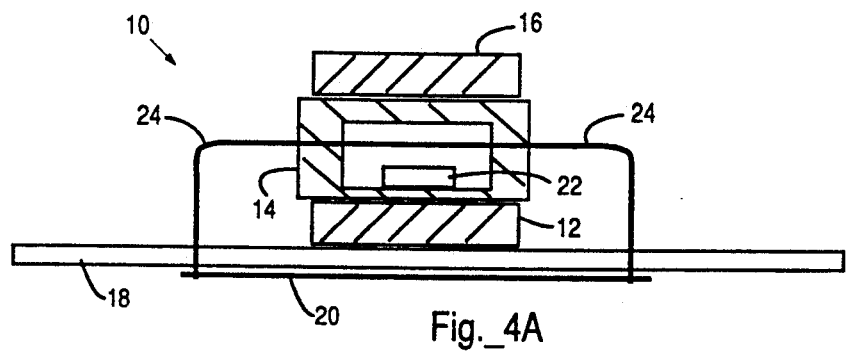
Fig._4A
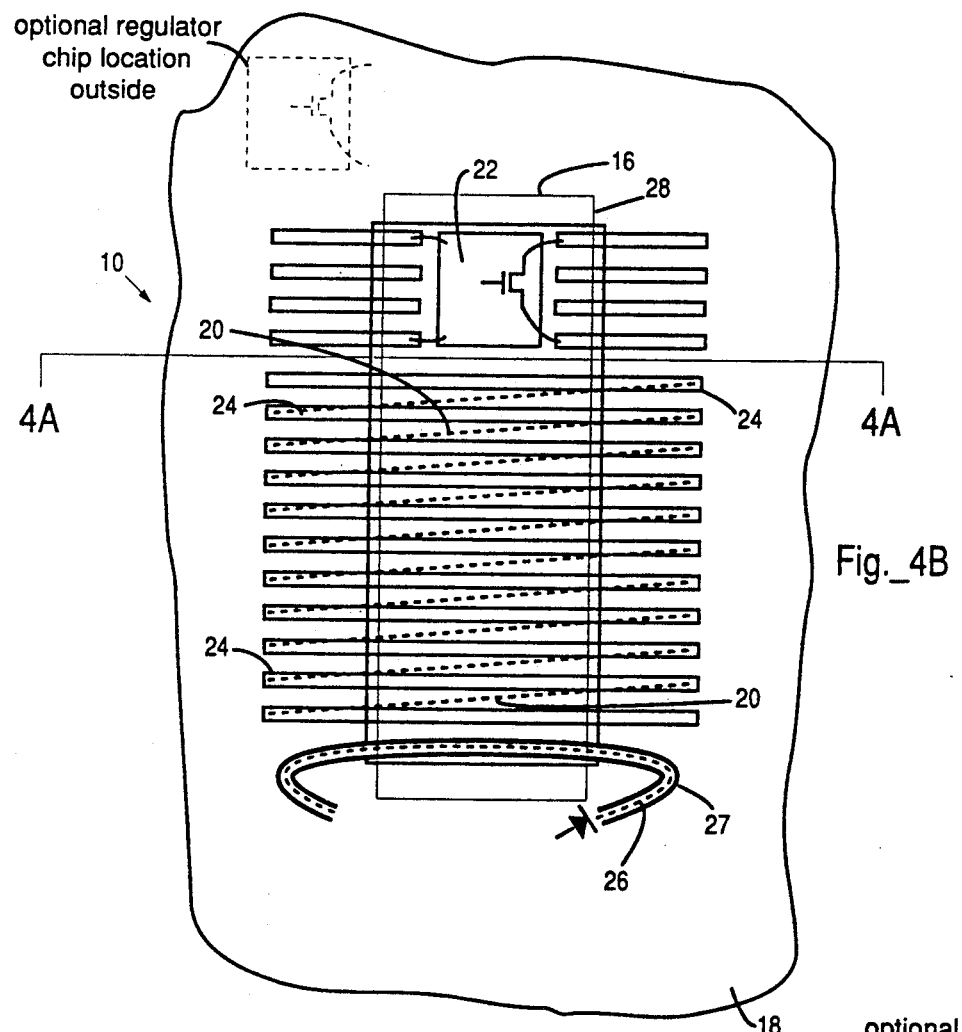
Fig._4B
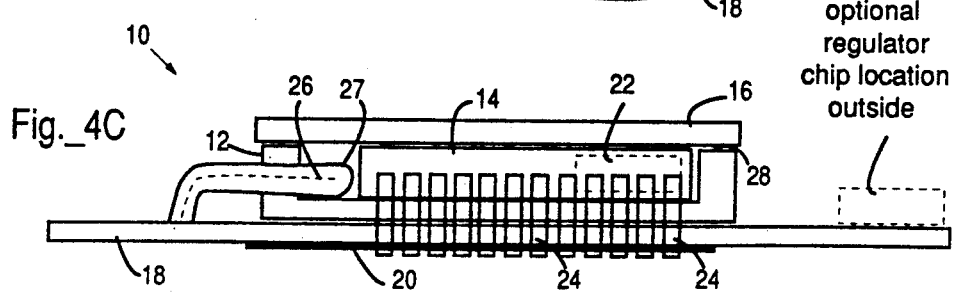
Fig._4C

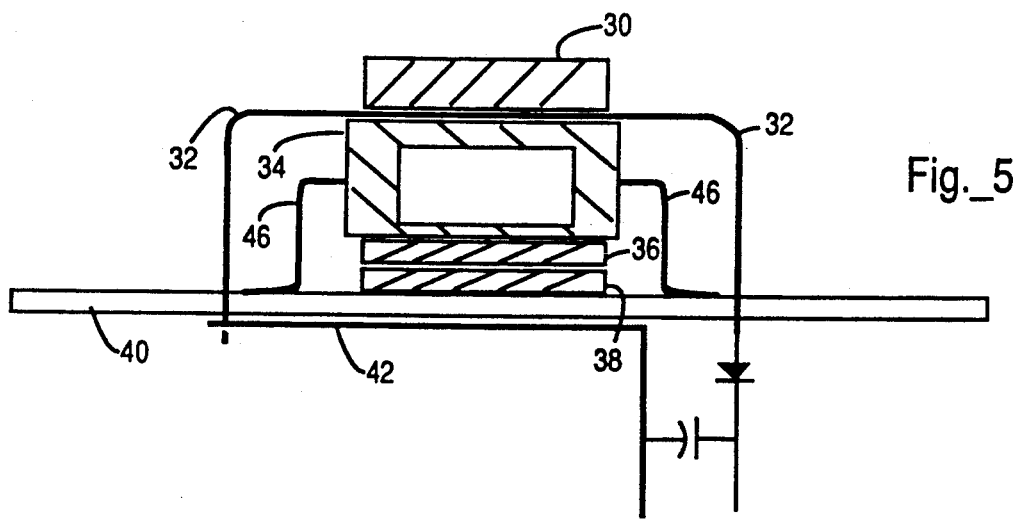
Fig._5
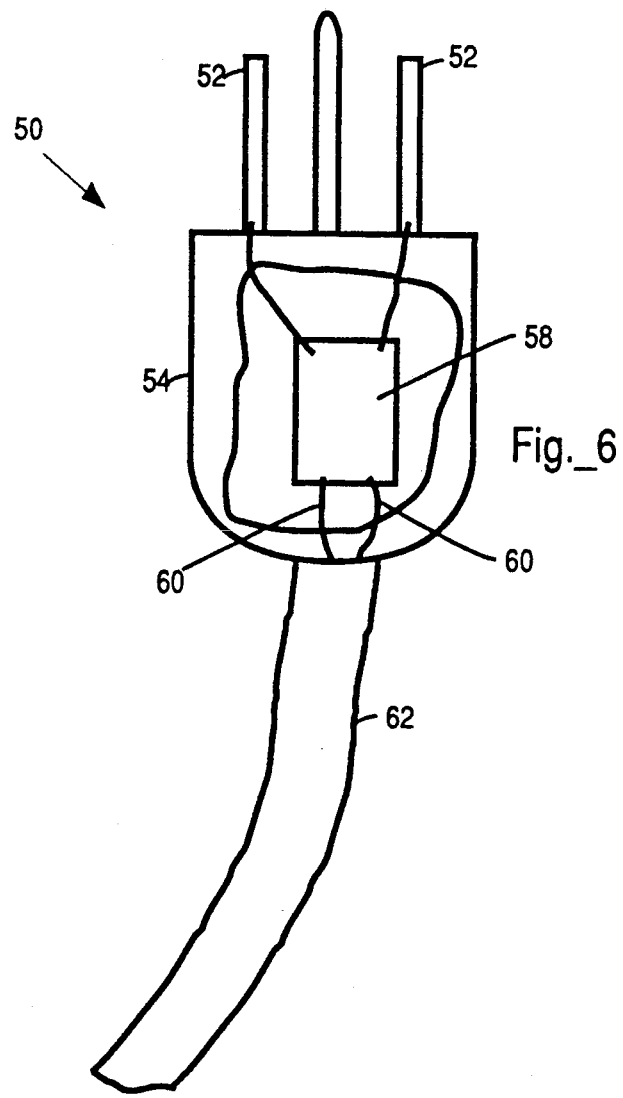
Fig._6

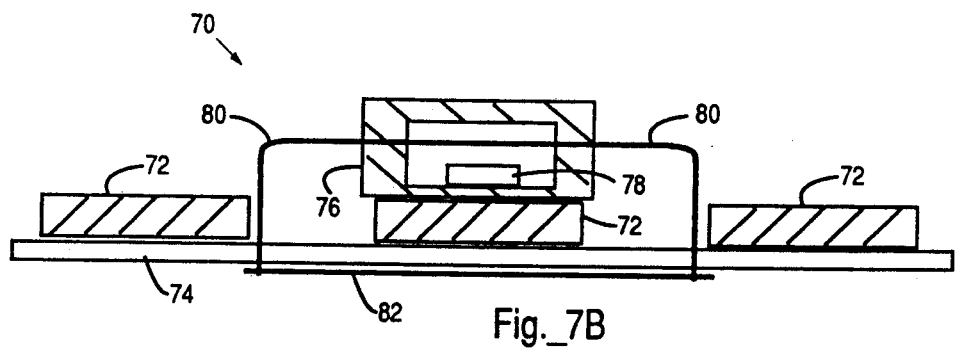
Fig._7B
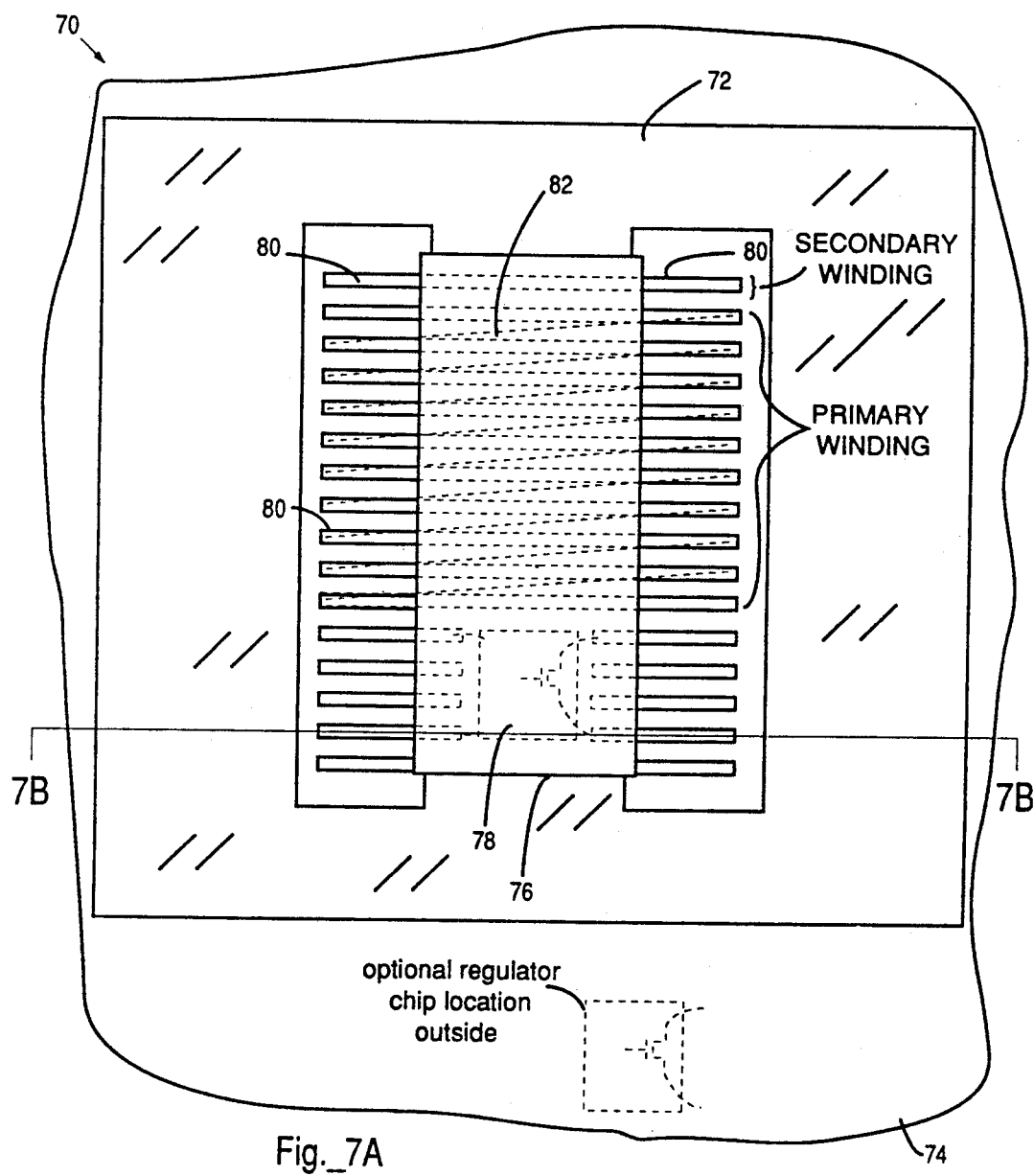
Fig._7A

HIGH FREQUENCY SWITCHED MODE CONVERTER

BACKGROUND OF THE INVENTION

1. Field of the Invention

The present invention relates to switching power supplies, or power converters, and more particularly to very small and low cost switching power converters whose structural configuration permits automated assembly and elimination of the conventional transformer.

2. Description of the Prior Art

The consumer electronics revolution has resulted in a wide array of small, highly portable devices that typically run on batteries. For example, small Japanese televisions, radios, and CD players almost universally are supplied in the United States with earphones for private listening and AC power adaptors to save battery drain. If the device does not come with an AC adaptor, one is usually easily available, either from the original manufacturer or an after market supplier.

Two basic kinds of AC adaptors are ubiquitous, the linear type and the switching type. The linear type uses large 60 Hz transformers. FIG. 1 is a schematic of a typical prior art linear type AC adaptor which incorporates a 60 Hz transformer. The switching type uses a circuit to chop incoming power into high frequency pulses and can use very small and light transformers. FIG. 2 is a schematic of a relatively expensive prior art switching type power supply which feeds back voltage, current and/or power, in a closed loop control circuit, to regulate its output. Below ten watts, it has been more cost effective for manufacturers to supply the linear type AC adaptor, even though the 60 Hz stepdown transformers can get quite bulky. At about ten watts, a cost-to-produce cross-over point is reached, and the more sophisticated switching type AC adaptors become cost effective. When switching type AC adaptors are used, the consumer benefits from the reduced size and weight of the unit that must be plugged into a wall plug.

Cost is a critical factor in being able to compete in the consumer electronics market. High performance is often not as important to consumers as low purchase cost. So manufacturers often choose to supply large and bulky 60 Hz transformers in plastic housings resembling bricks for their designs, even though smaller, lighter weight and more efficient designs are possible using switching power converters. One reason the linear type AC adaptor has a lower production cost is that the transformers used in switching type AC adaptors are difficult to assemble with automated equipment. Manual labor must be employed, and that lowers volumes and increases the per unit cost. Very often, the labor component in manufacturing costs is the biggest expense in producing power supplies under two watts.

Prior art linear type AC adaptors have efficiencies that reach only as high as fifty to sixty percent. A lot of power gets thrown-off as heat. These low efficiencies limit the power range of this type of power supply because the waste heat may make the unit too hot to handle, or dangerous to operate in certain situations.

Thus the prior art forces the designer or manufacturer of consumer electronic equipment to be faced with a choice between a heavy, large and inefficient linear power supply (which has a 60 Hz transformer) but which is inexpensive to produce, or a relatively light-weight, small-sized and very efficient switched mode power supply that is expensive to produce. Generally, the choice is made in favor of the lower cost, large, heavy and inefficient power supply.

Therefore a need exists for an AC adaptor technology that can provide the performance advantages of a switching type power supply, such as high efficiency, small size and light weight, while also providing the cost advantages of the 60 Hz transformer type power supplies. The present invention solves the problem of the expense of manufacturing a switching type power transformer by a novel method described below in detail.

SUMMARY OF THE PRESENT INVENTION

It is therefore an object of the present invention to provide an improved AC adaptor which requires less physical size and weight than prior art power converters.

It is a further object to provide an improved AC adaptor, with a power output in the range of zero to twenty watts, which eliminates the large 60 Hz transformers of prior art low end power converters.

It is a further object to provide an improved AC adaptor, with a power output in the range of zero to twenty watts, which eliminates the expensive magnetic components and assembly requirements of prior art high end switching power converters.

It is a further object to provide a method of manufacturing a very low cost, moderate performance AC adaptor with a power output in the range of zero to twenty watts.

Briefly, a preferred embodiment of the present invention includes a standard size dual-in-line (DIP) integrated circuit (IC) package mounted on a printed circuit board (PCB) over a ferrite U-core that is attached to the PCB, with an I-core going over it to complete the magnetic path with an optional air gap. Prior to placement of the I-core, a pre-formed insulated wire is inserted such that it will reside between the I-core and the U-core, in order to form the secondary winding. The primary winding is formed by making use of part of the IC package leadframe in conjunction with conductive traces on the bottom side of the PCB. The electronics required for the power supply can also be mounted in the same DIP package whose leadframe constitutes a portion of the primary winding. In this fashion, all of the components of a low power output, switching power supply (i.e. converter) can be assembled by means of conventional automated insertion (e.g. pick and place) assembly techniques, thereby reducing manufacturing costs.

In an alternative embodiment of the present invention, a U-shaped insulated copper foil is used to cover the entire chip package. While this structure gives lower leakage inductance, which is a desirable characteristic, it is also more costly to fabricate in that a surface mount chip package is required in addition to a two-sided PCB. A two-sided PCB is required for this structural configuration in order to provide a top layer to program the number of turns in the primary winding, and a bottom layer to complete the circuit for the secondary winding.

An advantage of the AC adaptor of the present invention is that it requires less physical size and weight than prior art power converters Another advantage is that the AC adaptor with a power output in the range of zero to twenty watts, eliminates the large 60 Hz transformers of prior art low end power converters by forming the primary transformer winding from a leadframe and conductive traces on a printed circuit board A further advantage is that the AC adaptor with a power output in the range of zero to twenty watts, eliminates the expensive magnetic components and assembly requirements of prior art high end switching power converters A further advantage of the present invention is that it allows for the low cost, non-labor intensive automated assembly of the electronics and magnetics of an AC adaptor. This leads to cost savings over conventional power converters typically used in consumer electronics.

A further advantage of the present invention is that it provides for a programmable number of primary turns by selecting the desired number of conductive traces used on the PCB.

A further advantage of the present invention is the small number of turns required for the primary and secondary windings of an AC adaptor thus conserving materials and reducing costs.

A further advantage of the present invention is that the very small size of an AC adaptor achievable by use of the inventive structural configuration permits an AC adaptor to be molded into the plug portion of an AC power cord. In this way the second AC outlet is not blocked as occurs frequently with conventional AC adaptors.

A further advantage of the present invention is the ability to reduce the shipping size and weight of packaged consumer electronic products once the heavy and bulky conventional AC adaptors are replaced with the small and lightweight power converters of the present invention. This reduced shipping size and weight obviously reduces shipping costs, thus providing a further competitive advantage.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a schematic diagram of a prior art power supply that uses a 60 Hz transformer with a linear regulator;

FIG. 2 is a schematic diagram of a prior art power supply that uses a high frequency transformer and a pulse width modulated (PWM) switching control;

FIG. 3 is a three dimensional perspective view of an embodiment of the present invention wherein a dual-in-line IC package is sandwiched between ferrite cores and is mounted to a printed circuit board;

FIGS. 4A, 4B, and 4C are cross-sectional, top, and side views, respectively, of the embodiment of FIG. 3 and illustrate in particular the placement of the regulator chip within the package and its relationship to the leadframe and traces on the PCB. The cross-section of FIG. 4A is taken along the line 4A—4A of FIG. 4B;

FIG. 5 illustrates an alternative embodiment of the present invention which utilizes an inverted U-shaped insulated copper foil;

FIG. 6 shows a cut-away view of a power converter assembly embodiment of the present invention molded into the plug portion of an AC power cord; and FIGS. 7A and 7B are top and cross-sectional views respectively, of an alternative embodiment of the present invention that has the magnetic cores lying flat against a PC board. The cross-section of FIG. 7B has been taken along the line 7B—7B of FIG. 7A.

DETAILED DESCRIPTION OF THE PREFERRED EMBODIMENTS

The invention is now described with reference to FIGS. 3 through 7 wherein like reference numerals represent like elements throughout the several drawing. Using standard size packages, materials and automatic assembly techniques, the present invention provides for the integration of semiconductor chip technology with magnetics to produce a complete power conversion function at low cost and with very few external components.

In FIG. 3, a system 10 comprises a ferrite U-core 12, an IC package 14, a ferrite I-core 16, a printed circuit board (PCB) 18 having a plurality of traces 20 on one side, a regulator chip 22, and a leadframe 24 of which the external portion visible on one side of IC package 14 is shown in FIG. 3. Regulator chip can alternatively be placed outside IC package 14 in a package of its own and mounted on PCB 18 proximate to leadframe 24. Traces 20 are on the bottom of PCB 18 and cannot be clearly shown in the perspective view of FIG. 3, so the reader is referred to FIGS. 4A and 4C. The connection ends of leadframe 24 can either have pins shaped for through-hole conventional mounting or bent surface mount technology (SMT) leads. The primary reasons to choose one type of mounting over the other are controlled by factors that are relatively unimportant to the functioning of the present invention and such choices are routinely made by those skilled in the art. The ferrite I-core and U-core are magnetic structural pieces having the respective "I" and "U" shapes, and are preferably high frequency types. The core materials are readily available from a number of suppliers, such as TDK and Siemens. Particular shapes and sizes may have to be custom made. In the preferred embodiment, one MHz cores are used and the U-core 12 is placed on the bottom so that leadframe 24 drops into a small well. The U-core 12 and I-core 16 can be swapped, but assembly of system 10 may not be as easy, and so is not preferred. IC package 14 is mounted on PCB 18 over ferrite I-core 16 that has been previously attached to the PCB 18. In a preferred embodiment, PCB 18 is a single-sided board having through-holes that need not be plated. (Plated through-holes in PCBs increase manufacturing costs.) A "one-sided" or "single-sided" PCB means the PCB has conductive traces on only one of its sides. Single-sided printed circuit boards are generally less expensive than those having multiple layers of interconnect, and so are preferred because lower cost is a principal goal of those who are expected to employ the present invention. The ferrite I-core 16 is mounted over the assembled components to complete a magnetic path.

As illustrated in FIGS. 4A, 4B, and 4C, prior to mounting I-core 16, a preformed insulated wire 26 is inserted to complete a secondary winding of a step-down transformer. Chip 22 and wire 26 are preferably at opposite ends from one another. In the preferred embodiment, preformed wire 26 is actually one of the wire leads of an axial-lead rectifier. Wire 26 acts as the transformer secondary, and is protected from shorts by an insulated sleeving 27 (e.g., wiring spaghetti). Alternatively, the secondary winding can be part of leadframe 24. However, using wire 26 insulated by sleeve 27 may be necessary to meet the requirements of electrical safety testing labs, such as Underwriters Laboratories (UL). The primary winding of the transformer thus created is formed from the combination and physical placement of the leadframe 24 and the plurality of conductive traces 20 on the PCB 18. The leadframe 24 has a chip mounting pad that is offset from the center so that regulator chip 22 can be mounted at one end of the leadframe 24. In this way, the remaining length of the leadframe 24 can be dedicated to forming a part of the primary winding. The body of IC package 14 takes its final shape when leadframe 24 is encapsulated with an insulating material 28, such as plastic, after regulator IC 22 has been positioned within IC package 14. Additionally, in order to provide space for the high frequency ferrite core underneath the IC package 14, either the leads may be cut slightly longer than usual, or the encapsulating plastic may be made slightly thinner than usual. There may be an air gap 28 between the I-core 16 and U-core 12 to adjust the magnetic properties of the resulting transformer. The typical number of turns in the primary winding of the present invention is ten to twenty. In the secondary winding, one to two turns is typical.

The number of primary turns can be programmed by manipulating the number of leadframe 24 connections to conductive traces 20 on PCB 18. Fewer turns obviously requires the use of less material and space. However, a lower number of turns means that higher switching frequencies are required to achieve the same power supply electrical performance. A lower number of turns also reduces the value of equivalent loss resistance across the winding due to the relatively high conductivity of ferrite cores. This effect alone limits the number of turns to no less than ten for currently available high frequency core material.

For lower leakage inductance, an I-core 30 (similar to I-core 16) and an inverted U-shaped insulated copper foil 32 cover an entire chip, as shown in FIG. 5. The foil 32 itself reduces the leakage inductance. This embodiment, however, requires the use of a surface mounted chip 34 (as opposed to a DIP IC), a U-core 36, an insulator 38, and a two-sided PCB 40. In this embodiment, the two-sided PCB 40 would provide one layer, the top side, for programming the number of primary winding turns, and the second layer, the bottom side, to complete the circuit for the secondary. Ferrite cores 30, 36 are used to provide the magnetic pathway. The layer of insulating material 38 is placed between the conductive traces on the top of the PCB 40 and ferrite U-core 36.

The small size of the AC adaptor of the present invention provides the opportunity to mold the assembly into the plug portion of an AC power cord. This market-enhancing product feature could be achieved using well-known plastic molding techniques, once the structural configuration of the present invention has been fabricated.

An example of this application of the present invention is shown in FIG. 6. An AC power cord, designated generally by reference numeral 50, is shown with part of the plug portion cut-away. In operation, AC power is applied to a pair of prongs 52, which extend outward from an insulated plug portion 54. Within the plug portion 54, AC power is electrically coupled to an AC adaptor 58 assembled by the method of the present invention. The DC output of AC adaptor 58 is electrically coupled to a pair of conductive leads 60 which are embedded within an insulator 62.

FIGS. 7A and 7B illustrate an alternative embodiment of the present invention, an AC adaptor 70 that has a magnetic core 72 that lies flat against a PC board 74. The advantage of AC adaptor 70 is that assembly is simplified, since the magnetic core 72 can be a single piece that is simply glued down to the PC board 74 before a DIP package 76 containing several transformer windings and a semiconductor chip, as described above, is soldered in. In applications that allow a non-isolated secondary winding or lower level of isolation between primary and secondary (low voltage DC-to-DC converting), both the primary and secondary windings can be contained in DIP package 76. This technique allows the secondary wire, such as wire 26 and sleeving 27 in FIG. 4B, to be eliminated. A regulator chip 78 can either be disposed within DIP package 76 or mounted on PC board 74 proximate to a lead frame 80. FIGS. 7A and 7B show the regulator chip 78 within DIP package 76 here merely for purposes of illustration of an acceptable location. Both a secondary and a primary winding are contained in leadframe 80. A plurality of connections 82 complete the primary coil comprised of lead frame 80.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An AC adaptor, comprising:
    a U-core magnetic structure;
    a leadframe which acts as a first portion of a primary winding of a transformer in magnetic proximity to the U-core magnetic structure, the leadframe encapsulated so as to form a standard DIP package;
    a substrate having conductive traces which act as a second portion of primary winding; and
    an I-core magnetic structure, said DIP package being mounted on said printed circuit board sandwiched between the I-core and U-core magnetic structures.

2. The switching AC adaptor of claim 1, further comprising:
    a switching regulator integrated circuit chip.

3. The switching AC adaptor of claim 2, wherein:
    the switching regulator integrated circuit chip is mounted on the leadframe and both the switching regulator integrated circuit chip and the leadframe are encapsulated in said DIP package.

4. The switching AC adaptor of claim 2, wherein:
    the switching regulator integrated circuit chip is proximate to and outside said DIP package.

5. The switching AC adaptor of claim 1, wherein:
    a part of the leadframe functions as a secondary winding that is magnetically coupled to said primary winding.

6. The switching AC adaptor of claim 1, wherein:
    the I-core magnetic structure and U-core magnetic structure are comprised of ferrite material.

7. The switching AC adaptor of claim 1, wherein:
    the substrate is a printed circuit board.

8. The switching AC adaptor of claim 1, wherein:
    the substrate is a one-sided printed circuit board having through holes.

9. The switching AC adaptor of claim 1, wherein:
the I-core magnetic structure, U-core magnetic structure, and leadframe, are capable of being assembled by automated assembly equipment onto the substrate such that manual labor needed to manufacture the assembly is minimized.

10. The switching AC adaptor of claim 1, wherein:
the leadframe is a surface mount technology type.

11. The switching AC adaptor of claim 1, further comprising:
a rectifying diode in series with said secondary winding.

12. A switching AC adaptor, comprising:
a U-core magnetic structure;
a leadframe which acts as a portion of a primary winding of a transformer in magnetic proximity to the U-core magnetic structure, the leadframe encapsulated so as to form an AC electrical plug;
a printed circuit board having conductive traces which act as a portion of said primary winding; and
an I-core magnetic structure, the leadframe being mounted on the printed circuit board over the U-core magnetic structure, and the I-core magnetic structure being mounted over the leadframe.

13. The switching AC adaptor of claim 12, further comprising:
a switching regulator integrated circuit chip that is mounted on the leadframe and both the switching regulator integrated circuit chip and the leadframe are encapsulated in said AC electrical plug.

14. The switching AC adaptor of claim 12, wherein:
a part of the leadframe functions as a secondary winding that is magnetically coupled to said primary winding.

15. The switching AC adaptor of claim 12, further comprising:
an insulated wire inserted between the I-core magnetic structure and the U-core magnetic structure such that it can act as a secondary winding.

16. The switching AC adaptor of claim 12, wherein:
the leadframe is a surface mount technology type.

17. A low leakage inductance, highly integrated, switching AC adaptor, comprising:
an I-core magnetic structure;
a leadframe which acts as one portion of a primary winding of a transformer in magnetic proximity to the I-core magnetic structure, the leadframe encapsulated within electrically insulating material;
a substrate having conductive traces which act as a second portion of said primary winding;
a U-core magnetic structure, the leadframe is mounted on the substrate sandwiched between the I-core and U-core magnetic structures;
a layer of insulating material between the substrate and the U-core;
a U-shaped insulated copper foil which forms a portion of a one turn secondary winding, said U-shaped foil is mounted on the substrate over the leadframe so that it is disposed between the leadframe and the I-core; and
a switching regulator integrated circuit chip, said chip mounted proximate to the leadframe.

18. The switching AC adaptor of claim 17, wherein:
the substrate is a two-layered printed circuit board.

19. The switching AC adaptor of claim 18, wherein:
a first one of said two layers forms a portion of said primary winding.

20. The switching AC adaptor of claim 18, wherein:
a second one of said two layers forms a portion of said secondary winding.

21. The switching AC adaptor of claim 17, wherein:
the leadframe is a surface mount type leadframe.

22. The switching AC adaptor of claim 17, wherein:
said assembly is molded into the plug portion of an AC power cord.

* * * * *